United States Patent
Kuo et al.

(10) Patent No.: US 9,431,356 B2
(45) Date of Patent: Aug. 30, 2016

(54) SEMICONDUCTOR DEVICE AND METHOD OF FORMING THE SAME

(71) Applicant: Taiwan Semiconductor Manufacturing Company, Ltd., Hsin-Chu (TW)

(72) Inventors: Hsi-Yu Kuo, Hsin-Chu (TW); Ko-Yi Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/446,557

(22) Filed: Jul. 30, 2014

(65) Prior Publication Data

US 2014/0339676 A1    Nov. 20, 2014

Related U.S. Application Data

(63) Continuation-in-part of application No. 13/763,337, filed on Feb. 8, 2013.

(51) Int. Cl.
*H01L 21/761* (2006.01)
*H01L 23/60* (2006.01)
*H01L 27/02* (2006.01)

(52) U.S. Cl.
CPC ............ *H01L 23/60* (2013.01); *H01L 21/761* (2013.01); *H01L 27/0259* (2013.01); *H01L 2924/0002* (2013.01)

(58) Field of Classification Search
CPC ........... H01L 27/0255; H01L 27/0259; H01L 29/87; H01L 21/823456; H01L 21/823857; H01L 27/0262
See application file for complete search history.

(56) References Cited

U.S. PATENT DOCUMENTS

| | | | |
|---|---|---|---|
| 4,652,895 A | 3/1987 | Roskos | |
| 5,212,398 A | 5/1993 | Matsunaga et al. | |
| 5,242,841 A * | 9/1993 | Smayling | H01L 21/823456 148/DIG. 151 |
| 5,557,139 A | 9/1996 | Palara | |
| 5,747,837 A | 5/1998 | Iwase et al. | |
| 7,525,779 B2 * | 4/2009 | Chen | H01L 27/0255 361/56 |
| 2002/0109190 A1 * | 8/2002 | Ker | H01L 29/87 257/355 |
| 2004/0075147 A1 * | 4/2004 | Ueda | H01L 21/823857 257/368 |
| 2006/0043489 A1 | 3/2006 | Chen et al. | |
| 2011/0248383 A1 * | 10/2011 | Ren | H01L 27/0259 257/577 |
| 2013/0082353 A1 | 4/2013 | Kuo et al. | |
| 2013/0200493 A1 * | 8/2013 | Sorgellos | H01L 29/87 257/577 |
| 2014/0054642 A1 * | 2/2014 | Edwards | H01L 27/0262 257/124 |
| 2014/0225157 A1 | 8/2014 | Kuo et al. | |
| 2014/0339676 A1 | 11/2014 | Kuo et al. | |

\* cited by examiner

*Primary Examiner* — Jerome Jackson, Jr.
*Assistant Examiner* — Fang-Xing Jiang
(74) *Attorney, Agent, or Firm* — Slater Matsil, LLP

(57) ABSTRACT

Semiconductor devices and methods of manufacture thereof are disclosed. In some embodiments, a semiconductor device includes: a substrate; a first region over the substrate, the first region comprising a first n type material; a second region over the substrate and laterally adjacent to the first region, the second region comprising a first p type material; a third region disposed within the second region and laterally separated from the first region, the third region comprising a second n type material; a fourth region disposed atop the third region, the fourth region comprising a second p type material; a fifth region disposed within the first region and laterally separated from the second region, the fifth region comprising a third p type material; and a sixth region disposed atop the fifth region, the sixth region comprising a third n type material.

17 Claims, 9 Drawing Sheets

SEMICONDUCTOR DEVICE AND METHOD OF FORMING THE SAME

PRIORITY CLAIM AND CROSS-REFERENCE

This application is a continuation-in-part of U.S. patent application Ser. No. 13/763,337, filed on Feb. 8, 2013, entitled "Methods and Apparatus for ESD Structures," which application is hereby incorporated herein by reference.

BACKGROUND

Electrostatic discharge (ESD) is the sudden flow of electricity between two objects caused by a contact, an electrical short, or a dielectric breakdown. ESD can be caused by a buildup of static electricity by tribocharging, or by electrostatic induction. ESD includes spectacular electric sparks, but also less dramatic forms which may be neither seen nor heard, yet large enough to cause damage to sensitive electronic devices. ESD can cause a range of harmful effects, as well as failure of integrated circuits (ICs).

Electrostatic discharge ("ESD") protection circuits are needed for ICs. The ESD protection circuits provide a path to bypass current from the terminal to a ground or from the terminal to a power supply rail, so that the current due to an ESD event bypasses the internal circuitry. Voltages far in excess of the normal operating voltages, in both positive and negative magnitudes, are observed during short duration electrostatic discharge events. The ESD protection circuits prevent the corresponding ESD current from destroying sensitive components in the protected IC.

An ESD protection circuit can be triggered in response to a trigger voltage over a threshold, and then safely conduct ESD stress current through an alternative path and thus protect the internal circuitry. After the ESD protection circuit is triggered, it will remain active as long as a voltage over a "holding voltage" is present. If the "holding voltage" for an ESD protection circuit is too low, the ESD protection circuit will likely stay active when the IC is no longer under ESD stress. Accordingly high holding voltages for ESD protection circuits are desirable.

Dynamically triggered MOS transistors are extensively used as ESD protection circuits in low voltage applications for many general purpose IO libraries. However, in high voltage applications, dynamically triggered MOS transistors typically occupy large areas. Furthermore, dynamically triggered MOS transistors are not suitable for applications that have a noisy power. Other alternatives for ESD protection circuits are snapback devices such as silicon controlled rectifier (SCR) circuits and bipolar junction transistors (BJTs), which have smaller silicon areas and reduced leakages. However, the holding voltage of these snapback devices is low in most cases, leading to a large gap between the trigger voltage and the holding voltage. Improved ESD protection circuits are needed with high holding voltages, and reduced gap between the trigger voltage and the holding voltage, which is more suitable for high voltage applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
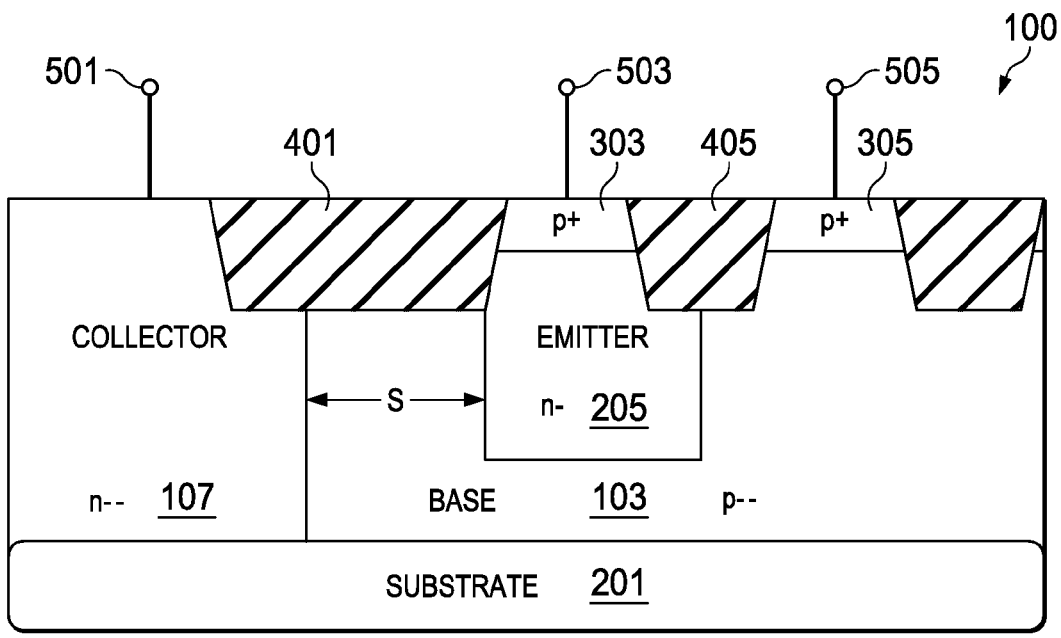
FIGS. 1(a)-1(d) illustrate ESD protection circuits, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1(a)-1(d) illustrate in cross sectional views and a circuit diagram of some embodiments of an ESD protection circuit 100. Semiconductor manufacturing processes that may be used to form the ESD protection circuit 100 include photolithography, wet and dry etching, plasma etching, ashing, chemical vapor deposition, plasma vapor deposition, plasma enhanced chemical vapor deposition, electroless plating and electroplating, silicidation, oxide deposition including thermal oxidation, tetraethoxysilane (TEOS), spun on glass and other oxide and nitride depositions, planarization processes such as chemical mechanical planarization (CMP), forming isolation regions using trenches or local oxidation of silicon (LOCOS) and the like.

In FIG. 1(a), a portion of a semiconductor substrate 201 is shown. The semiconductor substrate 201 may be a p type doped substrate, or an n type doped substrate, which means that the semiconductor substrate 201 may be doped with either n type or p type impurities or dopants. The semiconductor substrate 201 may include, or may consist of, silicon, gallium arsenide, silicon germanium or other semiconductor materials used in semiconductor device processing. Although in the illustrated examples presented herein for explanation a semiconductor substrate is used, in other alternative embodiments epitaxially grown semiconductor materials or a silicon on insulator (SOI) layer may be used as the semiconductor substrate 201.

Dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials. Dopant atoms for p type materials include boron, for example. In n type materials, dopant atoms include phosphorous, arsenic, and antimony, for example. Doping may be done by ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allow for in-situ doping during the epitaxial processes. Implantation can be done through certain materials, such as thin oxide layers.

The doping concentration amounts for the well region and the diffusions described may vary with the process used and the particular design. Doping concentrations of a p type material or an n type material may range from about $1 \times 10^{14}$ atoms/cm$^3$ to about $1 \times 10^{22}$ atoms/cm$^3$, and doping concentrations of a p+/n+ material may be greater than about $1 \times 10^{18}$ atoms/cm$^3$, for example. Some other ranges of doping concentrations may be used, such as a n−−/p−− material with a doping concentration less than about $1 \times 10^{14}$ atoms/cm$^3$, a n−/p− material with a doping concentration ranging from about $1 \times 10^{14}$ atoms/cm$^3$ to about $1 \times 10^{16}$ atoms/cm$^3$, a n/p material with a doping concentration ranging from about $1 \times 10^{16}$ atoms/cm$^3$ to about $1 \times 10^{18}$ atoms/cm$^3$, a n+/p+ material with a doping concentration ranging from about $1 \times 10^{18}$ atoms/cm$^3$ to about $1 \times 10^{20}$ atoms/cm$^3$, and a n++/p++ material with a doping concentration ranging larger than about $1 \times 10^{20}$ atoms/cm$^3$. Further alternative ranges of concentrations may be used, such as a n−/p− material with a doping concentration in a range from about $1 \times 10^{15}$ atoms/cm$^3$ to about $1 \times 10^{18}$ atoms/cm$^3$, and a n−/p− material with a doping concentration about 5 to about 100 times greater than the concentration of a n−−/p−− material.

Figure 1B:
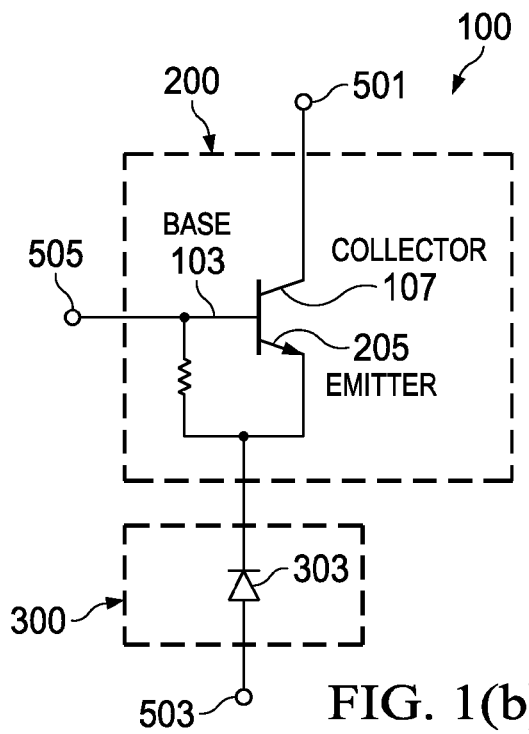
Figure 1C:
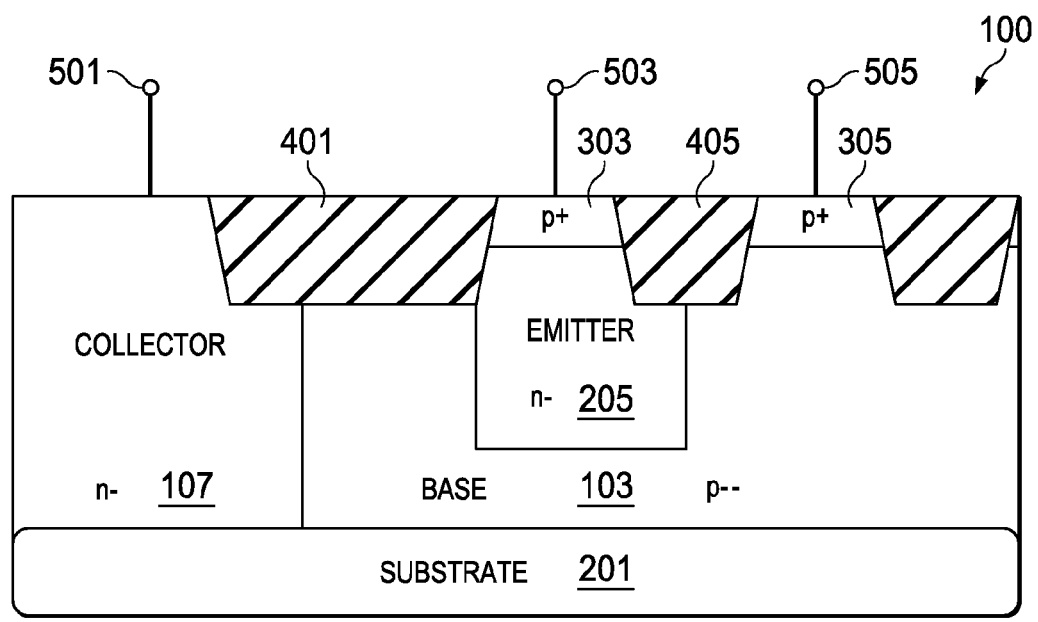

As shown in FIG. 1(a), the ESD protection circuit 100 may include a first region 107, a second region 103, a third region 205, and a fourth region 303. The first region 107 may include, or may consist of, a first n type material. In the embodiment shown in FIG. 1(a), the material of the first region 107 is shown as an n−− type material. However, it is understood that any other n type material may be used. For example, as shown in the embodiment of FIG. 1(c), the first region 107 includes, or consists of, an n− type material. As another example, in other embodiments, the first region 107 may include, or may consist of, an n type, n+ type, or n++ type material. These embodiments are not shown for the sake of simplicity and brevity.

The second region 103 may be disposed laterally adjacent to the first region 107 and may include, or may consist of, a first p type material. In the embodiment shown in FIG. 1(a), a sidewall of the second region 103 faces a sidewall of the first region 107 and is in contact (e.g. physical contact, e.g. direct physical contact) with the sidewall of the first region 107. The material of the second region 103 in the example of FIG. 1(a) is shown as a p−− type material. However, it is understood that any other p type material may be used. For example, in other embodiments, the second region 103 may include, or may consist of, a p− type, p type, p+ type, or p++ type material. These embodiments are not shown for the sake of simplicity and brevity.

The third region 205 may be proximate the second region 103 and may include, or may consist of, a second n type material. For example, in the embodiment of FIG. 1(a), a portion of the third region 205 may be disposed within the second region 103. In this particular embodiment, sidewalls of the third region 205 and a surface of the third region 205 facing the semiconductor substrate 201 are in contact (e.g. physical contact, e.g. direct physical contact) with the third region 205. In other words, the third region 205 may be partially surrounded by, or partially embedded in, the second region 103, as shown in the example of FIG. 1(a). The material of the third region 205 in FIG. 1(a) is shown as an n− type material. However, it is understood that any other n type material may be used. For example, in other embodiments, the third region 205 may include, or may consist of, an n−− type, n type, n+ type, or n++ type material. These embodiments are not shown for the sake of simplicity and brevity.

The fourth region 303 may be proximate the third region 205 and may include, or may consist of, a second p type material. For example, as shown in the embodiment of FIG. 1(a), the fourth region 303 may be disposed atop the third region 205. In another embodiment, a portion of the fourth region 303 may be disposed within the third region 205. For example, the fourth region 303 may protrude into a portion of the third region 205 and may be partially surrounded by, or partially embedded in, the third region 205. The material of the fourth region 303 in FIG. 1(a) is shown as a p+ type material. However, it is understood that any other p type material may be used. For example, in other embodiments, the fourth region 303 may include, or may consist of, a p−− type, p− type, p type, or p++ type material. These embodiments are not shown for the sake of simplicity and brevity.

The ESD protection circuit 100 may include a first isolation area 401, which may separate and/or electrically isolate the first region 107 from the third region 205 and the fourth region 303, as shown in the embodiment of FIG. 1(a). The first isolation area 401 may be disposed laterally adjacent to the fourth region 303. A second isolation area 405 may also be included in the ESD protection circuit 100. The second isolation area 405 may be disposed within the second region 103 and the third region 205 to separate and/or electrically isolate the fourth region 303 from the second region 103. The second isolation area 405 may be disposed laterally adjacent to the fourth region 303 on a side of the fourth region 303 facing away from the first isolation area 401, as shown in the embodiment of FIG. 1(a). The first isolation area 401 and the second isolation area 405 may be formed, for example, using shallow trench isolation (STI), where an oxide, nitride or similar dielectric is formed in a trench region. Alternative embodiments may include local oxidation of silicon (LOCOS) isolation, or any other form of isolation (e.g. electrical isolation).

The ESD protection circuit 100 may include a first contact 501, which may be electrically connected (e.g. via a direct physical connection) to the first region 107. Similarly, the ESD protection circuit 100 may include a second contact 503, which may be electrically connected (e.g. via a direct physical connection) to the fourth region 303.

A diffusion area 305, which may be an optional feature of the ESD protection circuit 100, may be formed laterally adjacent to the second isolation area 405 on a side of the second isolation area 405 facing away from the fourth region 303. The diffusion area 305 may be electrically connected (e.g. via a direct physical connection) to a third contact 505. The diffusion area 305 may include, or may consist of, another p type material. In the embodiment of FIG. 1(a), the diffusion area 305 is shown as a p+ material. However, it is understood that any other p type material may be used. For example, in other embodiments, the diffusion area 305 may include, or may consist of, a p−− type, p− type, p type, or p++ type material. In an alternative embodiment, the diffusion area 305 may be absent from the ESD protection circuit 100, and the third contact 505 may be connected directly to the second region 103.

In the embodiment shown in FIG. 1(a), a sidewall of the second region 103 is in direct physical contact with a sidewall of the first region 107 via a common boundary between the first region 107 and the second region 103. Since the first region 107 and the second region 103 include, or consist of, materials of different conductivity types, the common boundary between the first region 107 and the second region 103 forms a p-n junction. In the embodiment shown in FIG. 1(a), a portion of the third region 205 is disposed within the second region 103. Since the third region 205 and the second region 103 include, or consist of, materials of different conductivity types, the common boundary between the third region 205 and the second region 103 forms another p-n junction. The first region 107, the second region 103, and the third region 205 therefore function as a lateral NPN bipolar junction transistor (BJT) 200, as shown in FIG. 1(b) in a circuit schematic diagram. The lateral NPN BJT 200 includes a collector formed by the first region 107, a base formed by the second region 103, and an emitter formed by the third region 205. The first contact 501 may be identified as an electrical contact for the collector of the lateral NPN BJT 200, and the third contact 505 may be identified as an electrical contact for the base of the lateral NPN BJT 200.

In addition, the fourth region 303 may be formed atop and in direct physical contact with the third region 205. Since the third region 205 and the fourth region 303 include, or consist of, materials of different conductivity types, the common boundary of the third region 205 and the fourth region 303 forms yet another p-n junction, which may be identified as a first embedded PN diode 300, as shown in FIG. 1(b). The second contact 503 can therefore be identified as an electrical contact for the first embedded PN diode 300.

The p type material of the fourth region 303 formed atop the n type material of the third region 205 creates a barrier potential for the first embedded PN diode 300, which shifts a holding voltage for the ESD protection circuit 100 upwards from a holding voltage of the lateral NPN BJT 200 alone. As a result, the holding voltage of the ESD protection circuit 100 shown in FIG. 1(a) and FIG. 1(b) is substantially equal to a sum of the holding voltage of the lateral NPN BJT 200 and a block voltage of the first embedded PN diode 300. The higher holding voltage of the ESD protection circuit 100 reduces the gap between a trigger voltage of the ESD protection circuit 100 and the holding voltage of the ESD protection circuit 100. Consequently, the ESD protection circuit 100 may not remain active even when an IC to which it is connected is no longer under ESD stress.

The ESD protection circuit 100 includes a lateral NPNP structure, which can be manufactured in a process compatible with the standard CMOS process. Consequently, no additional masks or significant cost increases are incurred in the manufacture of the ESD protection circuit 100 shown in FIG. 1(a) and FIG. 1(b). Furthermore, the trigger voltage of the ESD protection circuit 100 may be varied by a layout parameter S, which may be measured in the embodiment of FIG. 1(a) as the distance between the boundary of the third region 205 and the boundary of the first region 107, as shown in FIG. 1(a). When the layout parameter S is changed, the ESD protection circuit 100 can have a different trigger voltage. For example, when the layout parameter S is reduced (namely, as the boundaries of the third region 205 and the first region 107 are brought closer to each other), the trigger voltage of the ESD protection circuit 100 decreases. On the other hand, when the layout parameter S is increased (namely, as the boundaries of the third region 205 and the first region 107 are spaced farther apart), the trigger voltage of the ESD protection circuit 100 increases.

As described above, different n type materials may be used for the first region 107 and the third region 205. For example, as shown in the embodiment of FIG. 1(c), an n− type material may be used for the first region 107, which acts as the collector for the lateral NPN BJT 200, while the second n type material used for the third region 205 is still an n− type material.

Figure 1D:
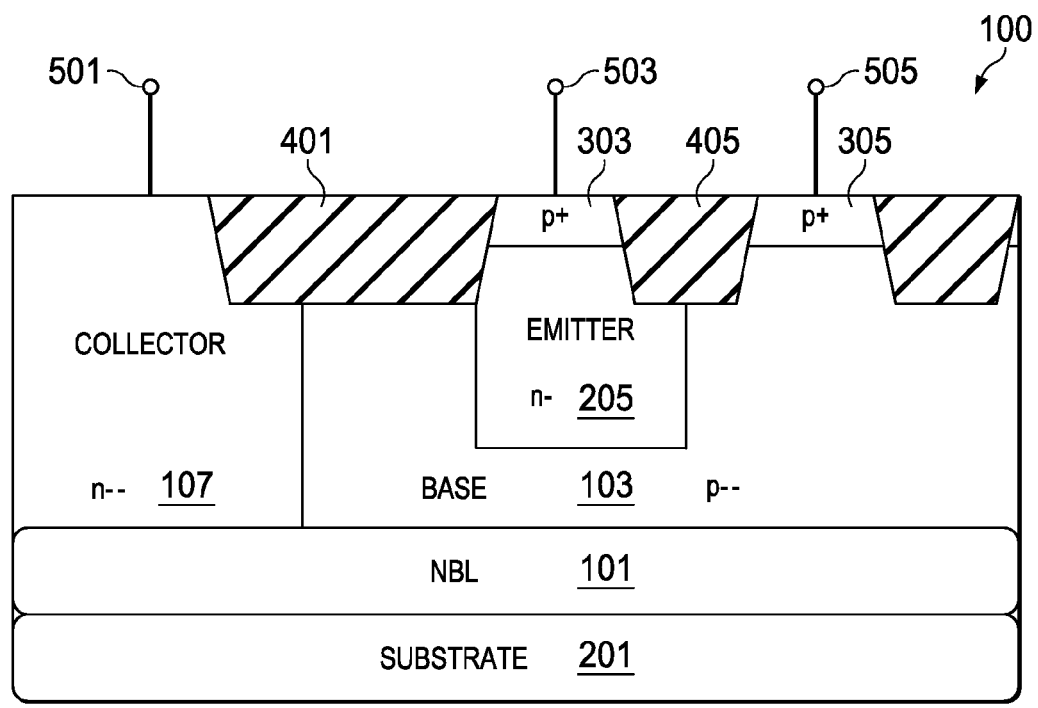

As illustrated in FIG. 1(d), an optional n type barrier layer (NBL) 101 may be disposed between the semiconductor substrate 201 and the various regions of the ESD protection circuit 100, such as the first region 107 and the second region 103. In other words, the first region 107 and the second region 103 may be disposed on the NBL 101. The NBL 101 may serve as a barrier against the movement of electrons and holes in a semiconductor material. The NBL 101 may be formed as a deep n type well, for example.

Figure 2A:
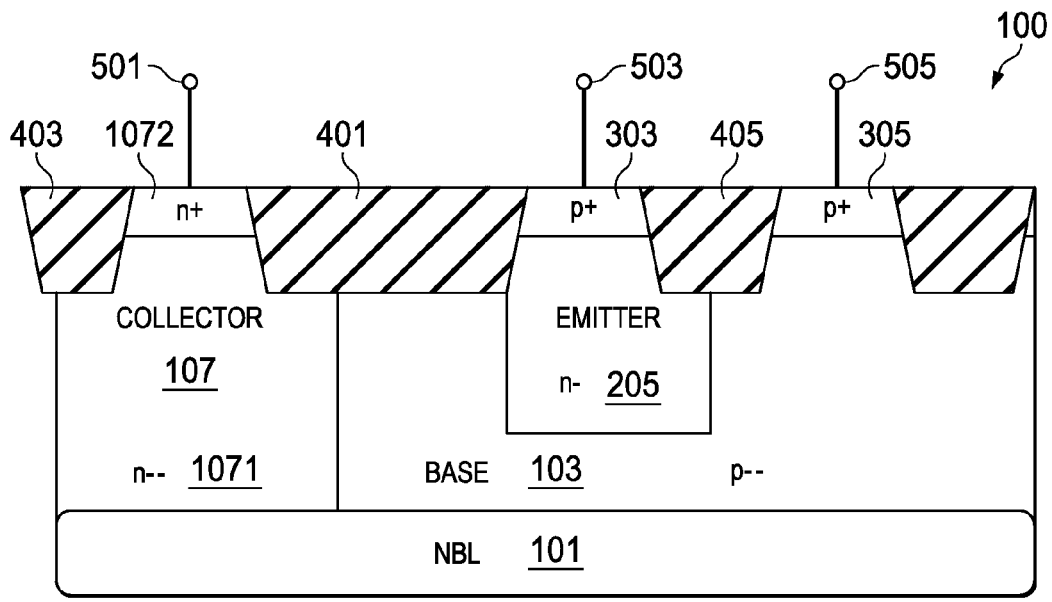
FIGS. 2(a)-2(c) illustrate additional embodiments of ESD protection circuits.
Figure 2B:
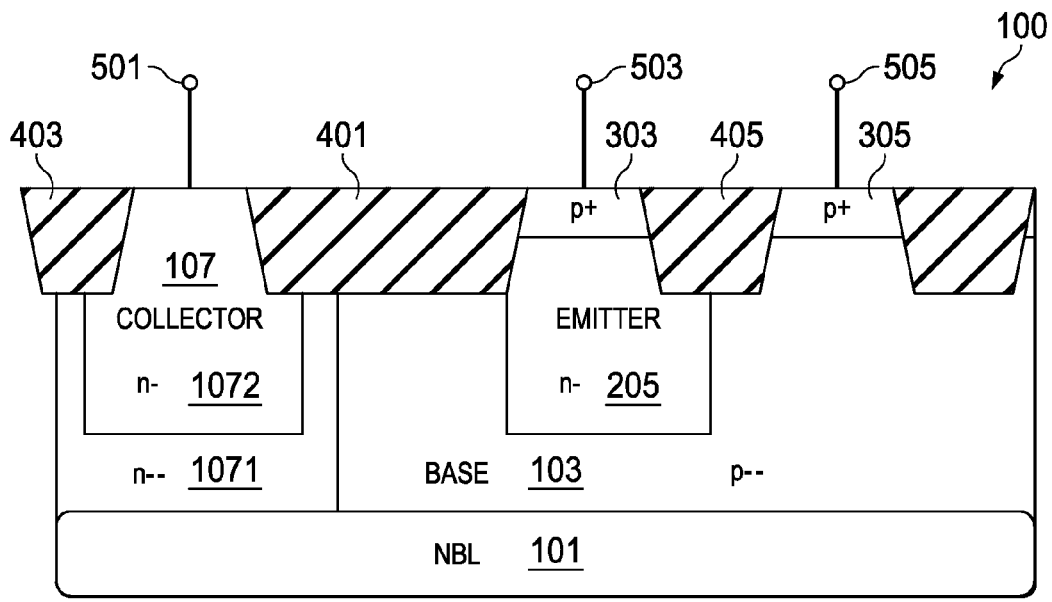
Figure 2C:
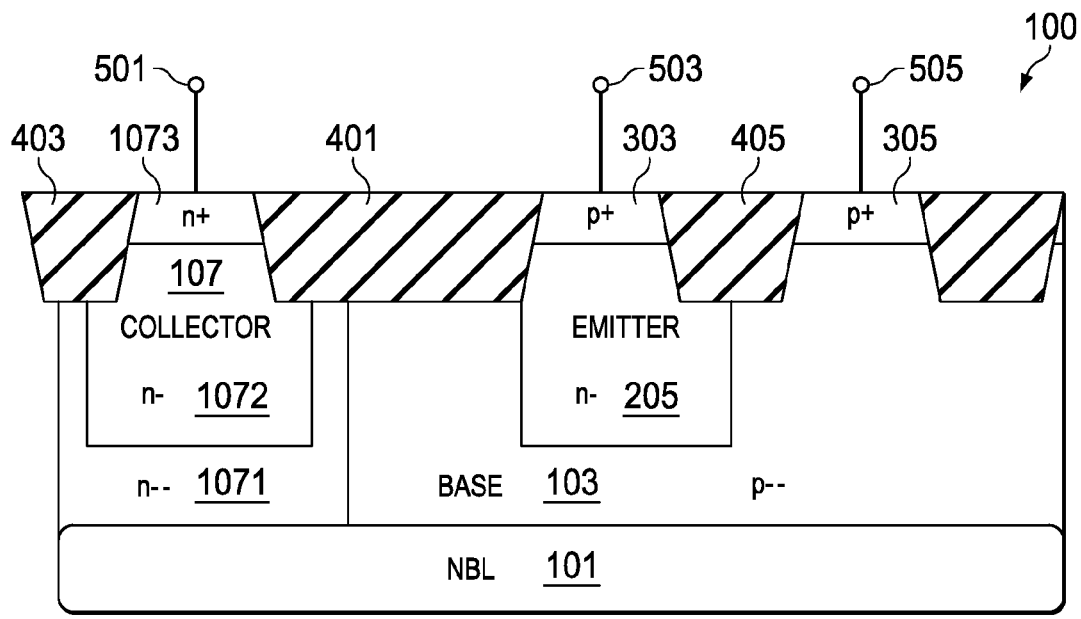

FIGS. 2(a)-2(c) illustrate in cross sectional views additional embodiments of ESD protection circuits, where the first region 107 may include multiple parts (e.g. two or more parts) with different n type materials. For example, as shown in the embodiment of FIG. 2(a), the first region 107 includes a first part 1071 and a second part 1072. The first part 1071 of the first region 107 may include, or may consist of, the first n type material, shown as an n−− type material in FIG. 2(a), and the second part 1072 of the first region 107 may include, or may consist of, another n type material, shown as an n+ type material in FIG. 2(a). Both the first part 1071 and the second part 1072 of the first region 107 function together as the collector of the lateral NPN BJT 200. It is understood that any other n type material may be used for the first part 1071 and/or the second part 1072 of the first region 107. For example, instead of the n−− type material shown in FIG. 2(a), the first part 1071 of the first region 107 may include, or may consist of, an n− type, n type, n+ type, or n++ type material. Similarly, instead of the n+ type material shown in FIG. 2(a), the second part 1072 of the first region 107 may include, or may consist of, an n−− type, n− type, n type, or n++ type material. For example, in the embodiment shown in FIG. 2(b), the second part 1072 of the first region 107 may include, or may consist of, an n− type material. An area of the second part 1072 shown in FIG. 2(b) may be larger compared to an area of the second part 1072 shown in FIG.

2(a). For example, the second part 1072 shown in FIG. 2(b) may extend deeper into the first region 107 compared to the second part 1072 shown in FIG. 2(a). In other words, a portion of the second part 1072 of the first region 107 shown in FIG. 2(b) may be disposed within the first part 1071 of the first region 107.

In other embodiments, the first region 107 may include more than two parts. For example, as shown in FIG. 2(c), the first region 107 may include the first part 1071, the second part 1072, and a third part 1073. In the example shown in FIG. 2(c), the first part 1071 includes, or consists of, the first n type material (shown as an n−− type material), the second part 1072 includes, or consists of, another n type material (shown as an n− type material), and the third part 1073 includes, or consists of, yet another n type material (shown as an n+ type material). The first part 1071, the second part 1072, and the third part 1073 of the first region 107 function together as the collector of the lateral NPN BJT 200. It is understood that any other n type material may be used for at least one of the first part 1071, the second part 1072, and the third part 1073 of the first region 107.

As described above in relation to FIG. 1(a), the embodiments in FIGS. 2(a)-2(c) further include the second region 103, the third region 205 (a portion of which is disposed within the second region 103), and the fourth region 303 disposed atop the third region 205. Similarly, the first isolation area 401 may separate or electrically isolate the first region 107 and the third region 205. The second region 103 is shown as a p−− type material, and the fourth region 303 is shown as a p+ type material, yet any other p type material may be used. The third region 205 is shown as an n− type material, yet any other n type material may be used. The first contact 501 may be electrically connected to the first region 107 and the second contact 503 may be electrically connected to the fourth region 303. The second isolation area 405 may be disposed within the second region 103 and the third region 205 and may separate or electrically isolate the fourth region 303 from the second region 103. In the embodiments of FIGS. 2(a)-2(c), a third isolation area 403 is also included in the ESD protection circuit 100. The diffusion area 305 may be formed laterally adjacent to the second isolation area 405, and connected to the third contact 505. The NBL 101 is under all the regions shown in FIGS. 2(a)-2(c).

Figure 3A:
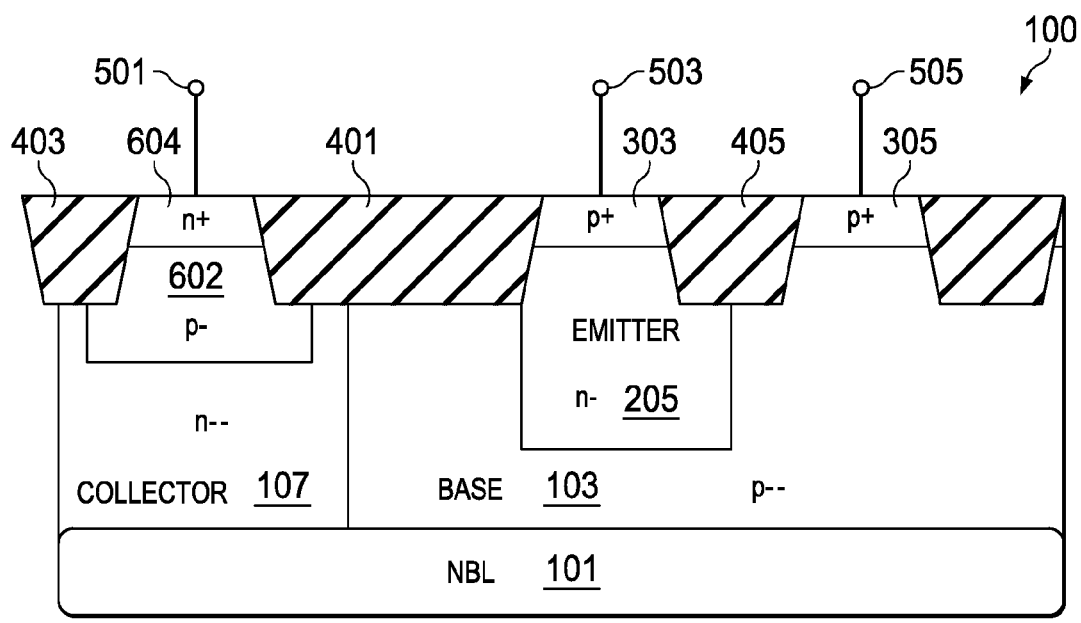
FIGS. 3(a)-3(b) illustrate an ESD protection circuit having a first embedded PN diode and a second embedded PN diode, in accordance with some embodiments.

FIG. 3(a) illustrates in a cross sectional view another embodiment of the ESD protection circuit 100. As shown in FIG. 3(a), the ESD protection circuit 100 may include the first region 107, the second region 103, the third region 205, and the fourth region 303. In addition, the ESD protection circuit 100 of FIG. 3(a) may include a fifth region 602 including, or consisting of, a third p type material and a sixth region 604 including, or consisting of, a third n type material.

In the embodiment shown in FIG. 3(a), the material of the fifth region 602 is shown as a p− type material. However, it is understood that any other p type material may be used. For example, in other embodiments, the fifth region 602 may include, or may consist of, a p−− type, p type, p+ type, or p++ type material. These embodiments are not shown for the sake of simplicity and brevity. The fifth region 602 may be formed within the first region 107. In other words, a portion of the fifth region 602 may be disposed within the first region 107. Stated in yet another way, the fifth region 602 may be partially surrounded by, or partially embedded in, the first region 107, as shown in the example of FIG. 3(a).

In the embodiment shown in FIG. 3(a), the material of the sixth region 604 is shown as an n+ type material. However, it is understood that any other n type material may be used. For example, in other embodiments, the sixth region 604 may include, or may consist of, a n−− type, n− type, n type, or n++ type material. These embodiments are not shown for the sake of simplicity and brevity. The sixth region 604 may be proximate the fifth region 602. For example, as shown in the embodiment of FIG. 3(a), the sixth region 604 may be disposed atop the fifth region 602. In another embodiment, the sixth region 604 may be formed within the fifth region 602. For example, the sixth region 604 may protrude into a portion of the fifth region 602 and may be partially surrounded by, or partially embedded in, the fifth region 602. As shown in the example of FIG. 3(a), the sixth region 604 may be disposed between the first isolation area 401 and the third isolation area 403. Furthermore, the first contact 501 may be electrically connected (e.g. via a direct physical connection) to the sixth region 604.

Figure 3B:
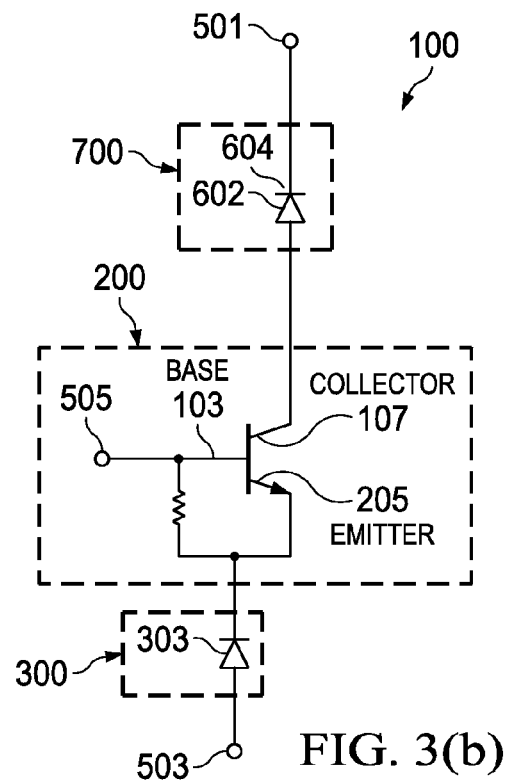

As in the embodiment of FIG. 1(a), the first region 107, the second region 103, and the third region 205 function as the lateral NPN BJT 200 shown in FIG. 3(b) in a circuit schematic diagram. The lateral NPN BJT 200 includes the collector formed by the first region 107, the base formed by the second region 103, and the emitter formed by the third region 205. The third contact 505 may be identified as the contact for the base of the lateral NPN BJT 200. Additionally, as in the embodiment of FIG. 1(a), the third region 205 and the fourth region 303 form another p-n junction and may be identified as the first embedded PN diode 300 shown in FIG. 3(b). The second contact 503 can therefore be identified as the contact for the first embedded PN diode 300.

In the embodiment shown in FIG. 3(a), a portion of the fifth region 602 is in direct physical contact with the first region 107 via a common boundary between the first region 107 and the fifth region 602. Since the first region 107 and the fifth region 602 include, or consist of, materials of different conductivity types, the common boundary between the first region 107 and the fifth region 602 forms a p-n junction. Similarly, since the fifth region 602 and the sixth region 604 include, or consist of, materials of different conductivity types, the common boundary between the fifth region 602 and the sixth region 604 thus forms another p-n junction. The fifth region 602 and the sixth region 604 may be identified as a second embedded PN diode 700 as shown in FIG. 3(b).

The p type material of the fifth region 602 and the n type material of the sixth region 604 create a barrier potential for the second embedded PN diode 700, which shifts a holding voltage for the ESD protection circuit 100 shown in FIG. 3(a) and FIG. 3(b) upwards from the sum of the holding voltage of the lateral NPN BJT 200 and the block voltage of the first embedded PN diode 300. For example, the holding voltage of the ESD protection circuit 100 shown in FIG. 3(a) and FIG. 3(b) is substantially equal to a sum of the holding voltage of the lateral NPN BJT 200 and the block voltages of both the first embedded PN diode 300 and the second embedded PN diode 700. Accordingly, the holding voltage of the ESD protection circuit 100 shown in FIGS. 3(a)-3(b) is larger than the holding voltage of the ESD protection circuit 100 shown in FIGS. 1(a)-1(d) and FIGS. 2(a)-2(c). Accordingly, the higher holding voltage of the ESD protection circuit 100 shown in FIG. 3(a) and FIG. 3(b) further reduces the gap between a trigger voltage and the holding voltage for the ESD protection circuit 100. Consequently, the ESD protection circuit 100 may not remain active even when an IC to which it is connected is no longer under ESD stress.

Figure 3C:
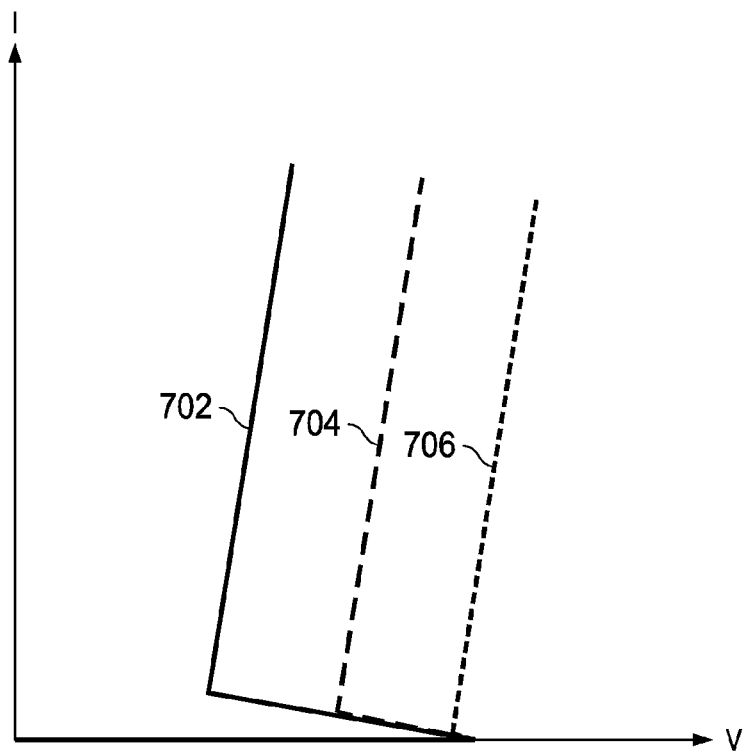
FIG. 3(c) shows a graph illustrating various holding voltages for various ESD protection circuits.

FIG. 3(c) shows a graph illustrating the holding voltages of the lateral NPN BJT 200, the ESD protection circuit 100 having only the first embedded PN diode 300, and the ESD protection circuit 100 having the first embedded PN diode 300 and the second embedded PN diode 700. The curve 702 may be identified as the holding voltage of the lateral NPN BJT 200 as a function of current. The curve 704 may be identified as the holding voltage of the ESD protection circuit 100 having only the first embedded PN diode 300 as a function of current. The curve 706 may be identified as the holding voltage of the ESD protection circuit 100 having the first embedded PN diode 300 and the second embedded PN diode 700 as a function of current. As shown in FIG. 3(c), the holding voltage of the ESD protection circuit 100 having the first embedded PN diode 300 and the second embedded PN diode 700 (illustrated as curve 706) is larger than that of the lateral NPN BJT 200 alone and of the ESD protection circuit 100 having only the first embedded PN diode 300. The addition of the first embedded PN diode 300 may boost or increase the holding voltage of the lateral NPN BJT 200 by about 8 Volts to about 15 Volts. The addition of the second embedded PN diode 700 may boost or increase the holding voltage of the ESD protection circuit 100 having only the first embedded PN diode 300 by about 8 Volts to about 20 Volts.

Figure 4A:
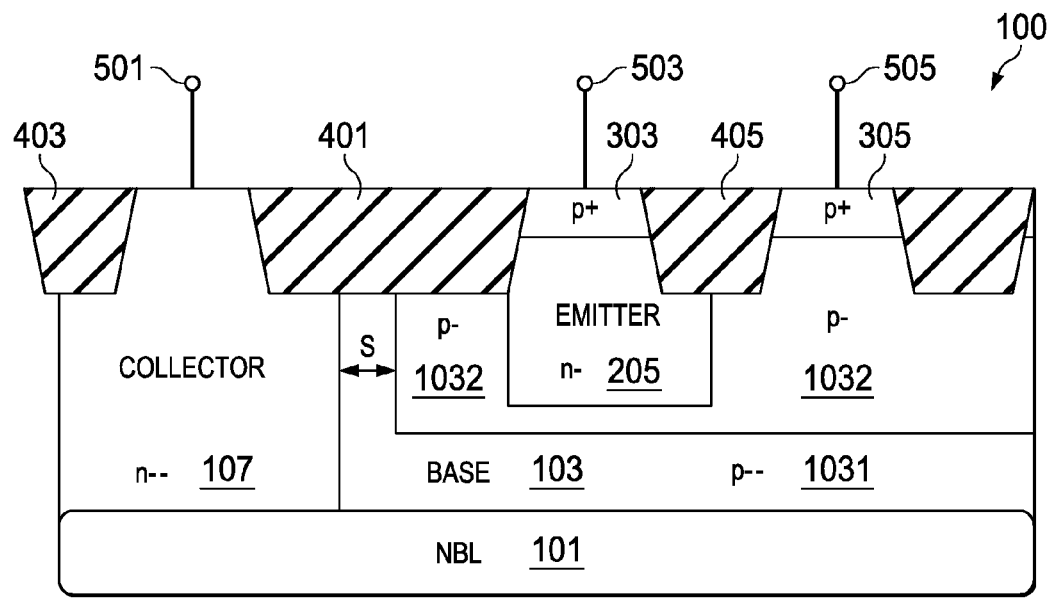
FIGS. 4(a)-4(b) illustrate in cross sectional views additional embodiments of ESD protection circuits.
Figure 4B:
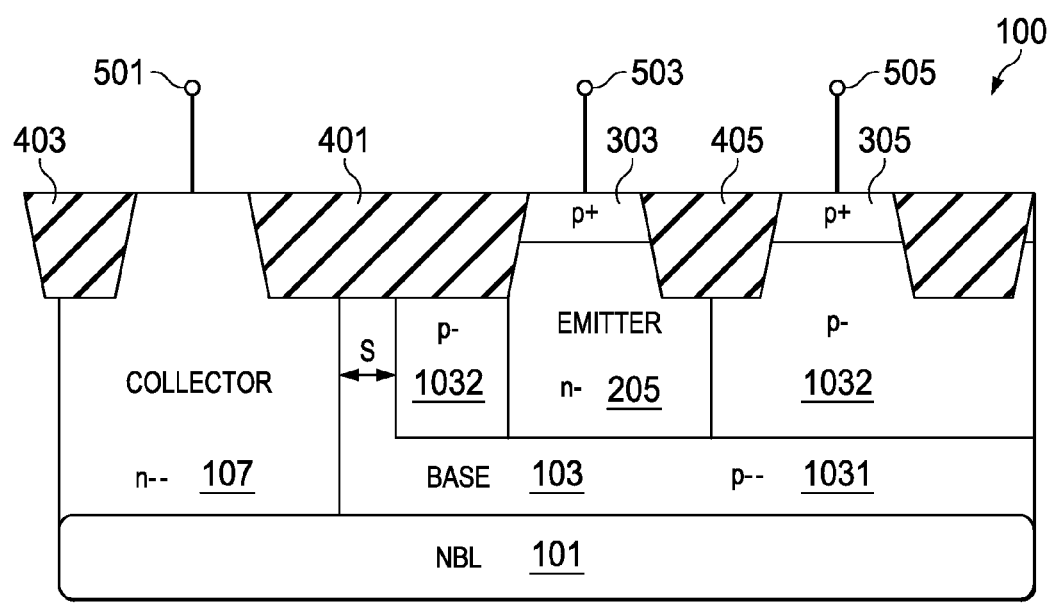

FIGS. 4(a)-4(b) illustrate in cross sectional views additional embodiments of ESD protection circuits, where the second region 103 may include multiple parts (e.g. two or more parts) with different p type materials. For example, as shown in FIG. 4(a), the second region 103 may include a first part 1031 of a p−− type material and a second part 1032 of a p− type material, while both the first part 1031 and the second part 1032 of the second region 103 function together as the base for the lateral NPN BJT 200. As shown in FIG. 4(a), a portion of the second part 1032 of the second region 103 may be disposed within the first part 1031 of the second region 103. In other words, the second part 1032 of the second region 103 may be partially surrounded by, or partially embedded in, the first part 1031 of the second region 103. In the embodiment of FIG. 4(a), the second part 1032 of the second region 103 is a continuous part having first and second sub-parts laterally adjacent opposite sides of the third region 205 and a third sub-part beneath the third region 205 that connects the first and second sub-parts together. In other words, in the embodiment shown in FIG. 4(a), the second part 1032 of the second region 103 may be formed so that the second part 1032 extends below as well as laterally adjacent to the third region 205.

Furthermore, the trigger voltage of the ESD protection circuit 100 shown in FIG. 4(a) may be determined by the layout parameter S, which is the distance between the boundary of the second part 1032 of the second region 103, to the boundary of the first region 107. When the layout parameter S is changed, the ESD protection circuit 100 can have a different trigger voltage, e.g. in the manner described above in relation to FIG. 1(a).

Alternatively, as shown in FIG. 4(b), the second region 103 may include the first part 1031 and the second part 1032, where the second part 1032 is formed so that the third region 205 extends to a bottom of the second part 1032 of the second region 103, and the third region 205 separates the second part 1032 into two discontinuous region in the cross-sectional view. The first part 1031 of the second region 103 may include, or may consist of, a p−− type material, and the second part 1032 of the second region 103 may include, or may consist of, a p− type material, while both the first part 1031 and the second part 1032 of the second region 103 function together as the base for the lateral NPN BJT 200.

The embodiments shown in FIGS. 4(a)-4(b) further include the first region 107, the third region 205 (a portion of which is disposed within the second region 103), and the fourth region 303 formed atop the third region 205. The first isolation area 401 separates or electrically isolates the first region 107 and the third region 205. The first region 107 is shown as an n−− material, yet any other n type material may be used, and the fourth region 303 is shown as a p+ type material, yet any other p type material may be used. The third region 205 is shown as an n− type material, yet any other n type material may be used. The first contact 501 may be electrically connected to the first region 107 and the second contact 503 may be electrically connected to the fourth region 303. The second isolation area 405 may be disposed within the second region 103 and the third region 205 to separate or electrically isolate the fourth region 303 from other area of the two regions. The third isolation area 403 is further included in the embodiments of FIGS. 4(a)-4(b). The diffusion area 305 may be formed next to the second isolation area 405 and may be connected to the third contact 505. The NBL 101 is under all the regions shown in FIGS. 4(a)-4(b).

The various arrangements of the first region 107 shown in FIGS. 2(a)-2(c) and the various arrangements of the second region 103 shown in FIGS. 4(a)-4(b), in addition to those formations not shown (e.g. having other types of p or n type materials), may be combined together to provide other embodiments of the ESD protection circuit 100. For example, the first region 107 of FIG. 2(a) including the first part 1071 and the second part 1072 may be combined with the second region 103 of FIG. 4(a) to form the ESD protection circuit 100 shown in FIG. 5(a). The first part 1071 of the first region 107 may include, or may consist of, an n−− type material and the second part 1072 of the first region may include, or may consist of, an n+ type material. The second region 103 may include the first part 1031 and the second part 1032. The first part 1031 of the second region 103 may include, or may consist of, a p−− type material and the second part 1032 of the second region 103 may include, or may consist of, a p− type material. The first part 1071 and the second part 1072 of the first region 107 function as the collector of the lateral NPN BJT 200. The first part 1031 and the second part 1032 of the second region 103 function as the base of the lateral NPN BJT 200.

Figure 5A:
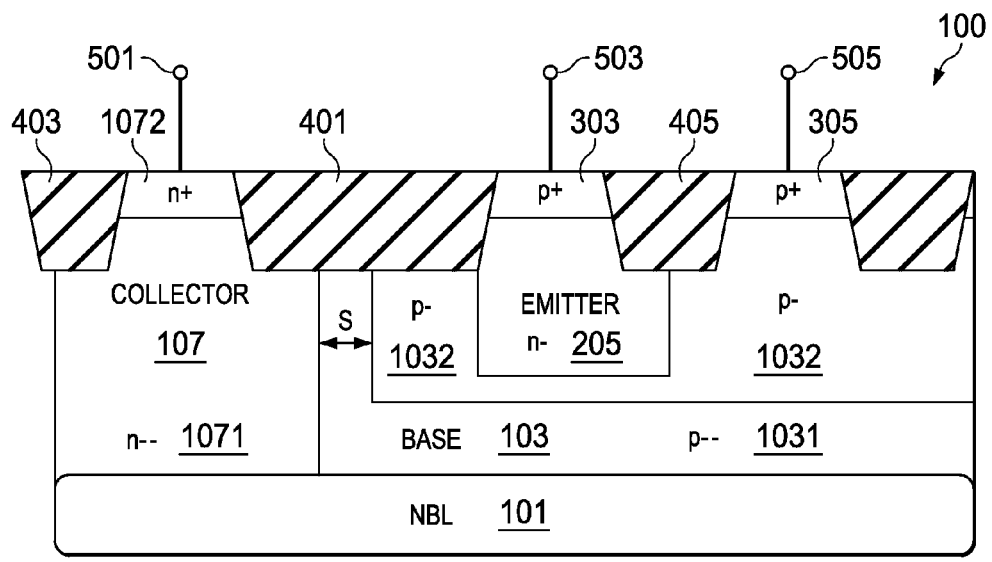
FIGS. 5(a)-5(c) and 6(a)-6(b) illustrate in cross sectional views and a circuit diagram of additional embodiments of ESD protection circuits.
Figure 5B:
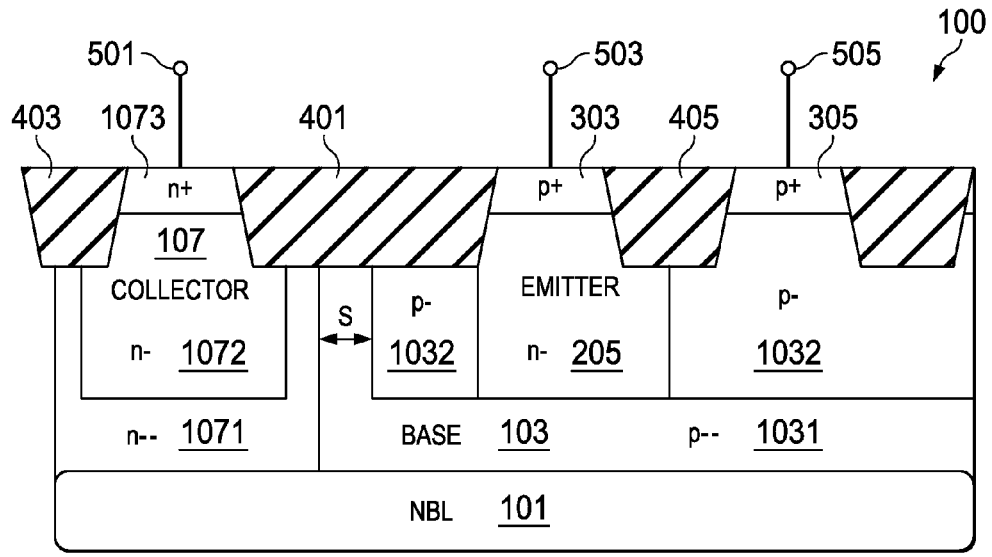
Figure 5C:
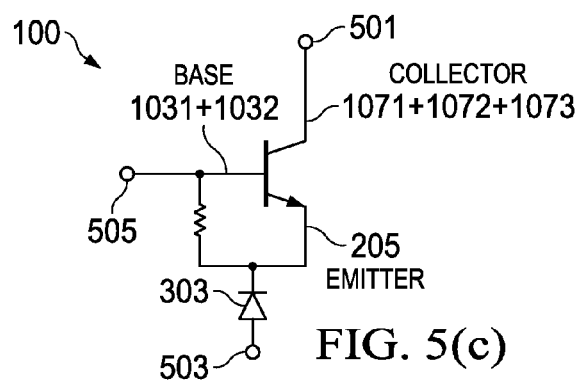

In another embodiment, the first region 107 of FIG. 2(c) including the first part 1071, the second part 1072, and the third part 1073 may be combined with the second region 103 of FIG. 4(b) to form the ESD protection circuit 100 shown in FIG. 5(b). The first part 1071 of the first region 107 may include, or may consist of, an n−− type material, the second part 1072 of the first region 107 may include, or may consist of, an n− type material, and the third part 1073 may include, or may consist of, an n+ type material. The second region 103 may include the first part 1031 and the second part 1032. The first part 1031 of the second region 103 may include, or may consist of, a p−− type material and the second part 1032 of the second region 103 may include, or may consist of, a p− type material. The first part 1071, the second part 1072, and the third part 1073 of the first region 107 function as the collector of the lateral NPN BJT 200 as shown in the circuit schematic diagram FIG. 5(c). The first part 1031 and the second part 1032 of the second region 103 function as the base of the lateral NPN BJT 200 as shown in the circuit schematic diagram FIG. 5(c).

The embodiments in FIGS. 5(a)-5(b) further include the third region 205 formed within the second region 103, and the fourth region 303 formed atop the third region 205. The first isolation area 401 is formed to separate the first region 107 and the third region 205. The first region 107 is shown as an n-- material, yet any other n type material may be used, and the fourth region 303 is shown as a p+ type material, yet any other p type material may be used. The third region 205 is shown as an n- type material, yet any other n type material may be used. The first contact 501 may be formed in connection with the first region 107 and the second contact 503 may be formed in connection with the fourth region 303. The second isolation area 405 may be formed within the second region 103 and the third region 205 to separate the fourth region 303 from other area of the two regions. The third isolation area 403 is further formed. The diffusion area 305 may be formed next to the second isolation area 405 and may be connected to the third contact 505. The NBL 101 is under all the regions shown in FIGS. 5(a)-5(b).

The ESD protection circuit 100 shown in FIG. 3(a) having the fifth region 602 and the sixth region 604 may be combined with the various arrangements of the second region 103 shown in FIGS. 4(a)-4(b) to provide other embodiments of the ESD protection circuit 100. For example, the second region 103 of FIG. 4(a) including the first part 1031 and the second part 1032 may be combined with the fifth region 602 and the sixth region 604 of FIG. 3(a) to form the ESD protection circuit 100 shown in FIG. 6(a). The first part 1031 of the second region 103 may include, or may consist of, a p-- type material and the second part 1032 of the second region 103 may include, or may consist of, a p- type material. The first region 107 functions as the collector of the lateral NPN BJT 200, and the first part 1031 and the second part 1032 of the second region 103 function as the base of the lateral NPN BJT 200.

Figure 6A:
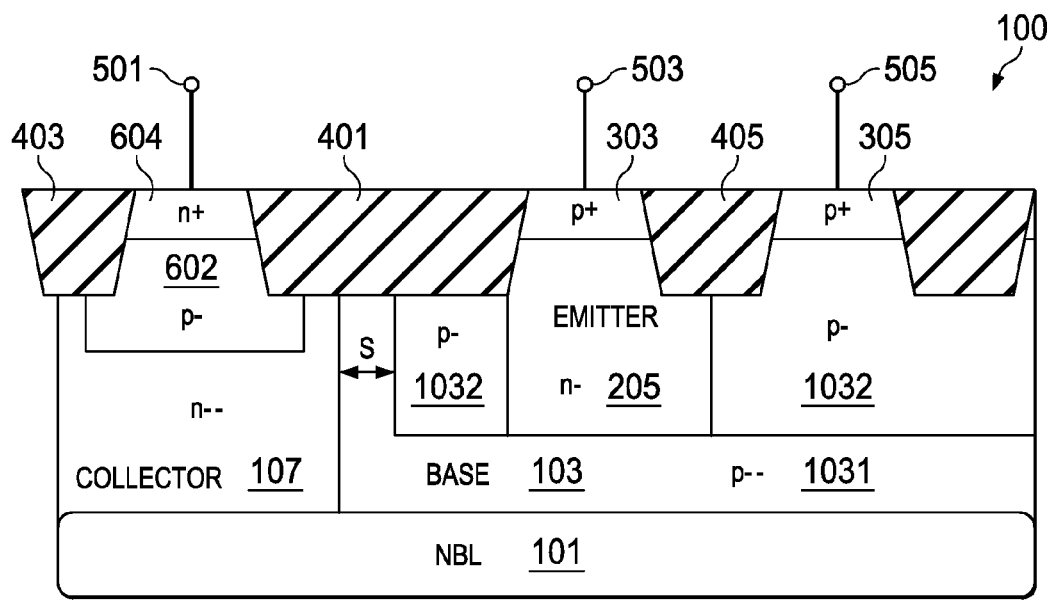
Figure 6B:
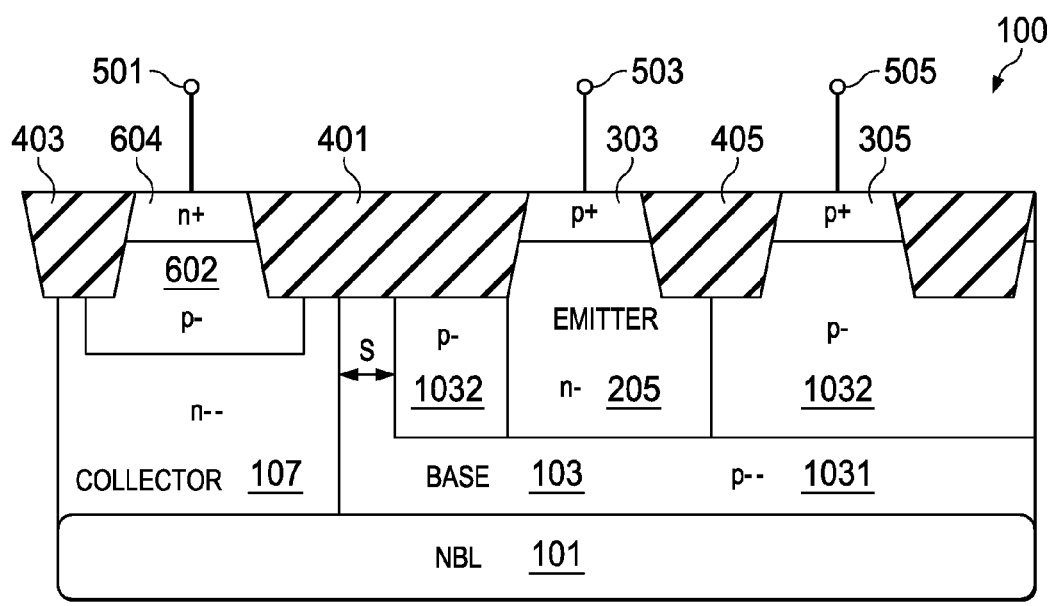

In another embodiment, the second region 103 of FIG. 4(b) including the first part 1031 and the second part 1032 may be combined with the fifth region 602 and the sixth region 604 of FIG. 3(a) to form the ESD protection circuit 100 shown in FIG. 6(b). The first part 1031 of the second region 103 may include, or may consist of, a p-- type material and the second part 1032 of the second region 103 may include, or may consist of, a p- type material. The first region 107 functions as the collector of the lateral NPN BJT 200, and the first part 1031 and the second part 1032 of the second region 103 function as the base of the lateral NPN BJT 200.

The embodiments in FIGS. 6(a)-6(b) further include the third region 205 formed within the second region 103, and the fourth region 303 formed atop the third region 205. The first isolation area 401 is formed to separate the first region 107 and the third region 205. The first region 107 is shown as an n-- material, yet any other n type material may be used, and the fourth region 303 is shown as a p+ type material, yet any other p type material may be used. The third region 205 is shown as an n- type material, yet any other n type material may be used. The first contact 501 may be formed in connection with the sixth region 604 and the second contact 503 may be formed in connection with the fourth region 303. The second isolation area 405 may be formed within the second region 103 and the third region 205 to separate the fourth region 303 from other area of the two regions. The third isolation area 403 is further formed. The diffusion area 305 may be formed next to the second isolation area 405 and may be connected to the third contact 505. The NBL 101 is under all the regions shown in FIGS. 6(a)-6(b).

Figure 7:
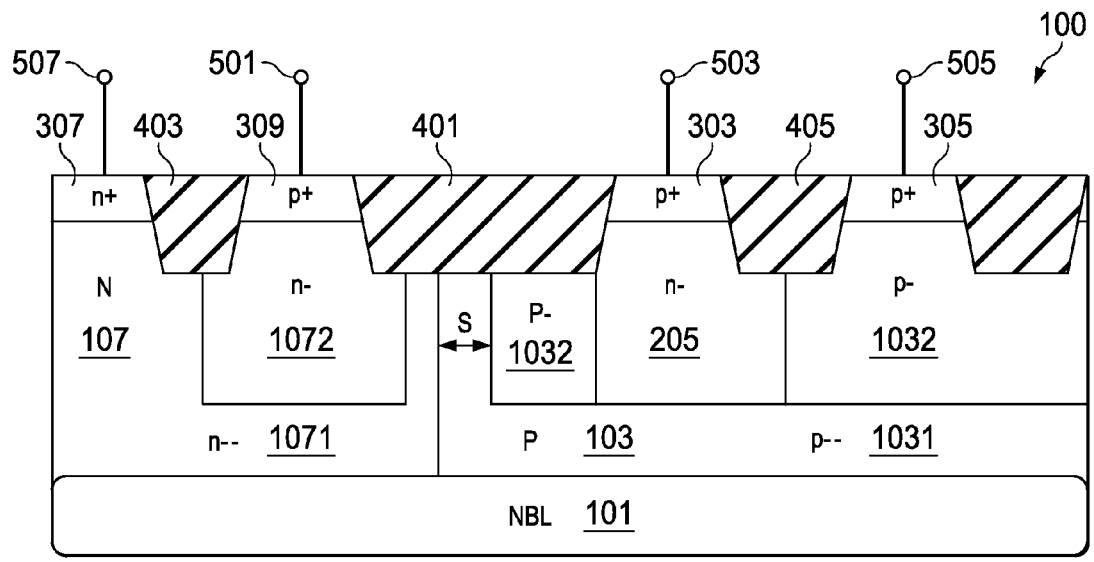
FIG. 7 illustrates an additional embodiment of an ESD protection circuit.

FIG. 7 illustrates an additional embodiment of the ESD protection circuit 100, where a seventh region 309 is disposed atop the first region 107 (e.g. atop the second part 1072 of the first region 107). The seventh region 309 is shown as a p+ type material, yet any other p type material may be used. Similar to embodiments shown in FIGS. 2(a)-2(c), the first region 107 shown in FIG. 7 includes the first part 1071 and the second part 1072. The first part 1071 of the first region 107 includes, or consists of, an n-- type material, and the second part 1072 of the first region 107 includes, or consists of, an n- type material, yet any other n type material may be used for either part. Alternatively, the first region 107 may include more than two parts, or include only one part, with any kind of n type material. Similar to embodiment shown in FIG. 4(b), the second region 103 shown in FIG. 7 includes the first part 1031 and the second part 1032. The first part 1031 of the second region 103 includes, or consists of, a p-- type material, and the second part 1032 of the second region 103 includes, or consists of, a p- type material, yet any other p type material may be used for either part. Alternatively, the second region 103 may include more than two parts, or comprise only one part, with any kind of p type material.

The embodiment shown in FIG. 7 further includes the third region 205 formed within the second region 103, and the fourth region 303 formed within the third region 205. The first isolation area 401 is formed to separate the first region 107 and the third region 205. The third region 205 is shown as an n- type material, yet any other n type material may be used. The fourth region 303 is shown as a p+ type material, yet any other p type material may be used.

The first contact 501 may be formed in connection with the seventh region 309 and the second contact 503 may be formed in connection with the fourth region 303. The second isolation area 405 may be formed within the second region 103 and the third region 205 to separate the fourth region 303 from other area of the two regions. A fourth contact 507 may be connected to the first region 107 by way of an eighth region 307 of a different n type material, such as the n+ type material shown in FIG. 7. The eighth region 307 may be separated from the seventh region 309 by the third isolation area 403. Alternatively, the eighth region 307 may be absent from the embodiment and the fourth contact 507 may be connected to the first region 107 directly. This particular embodiment is not shown for the sake of brevity. The diffusion area 305 may be formed next to the second isolation area 405, and connected to the third contact 505. The NBL 101 is shown in FIG. 7 as being disposed below all the regions.

As shown in FIG. 7, the seventh region 309 including the p type material, the first region 107, the second region 103, and the third region 205 may function as a SCR circuit of PNPN structure. Furthermore, the third region 205 and the fourth region 303 may function as the first embedded PN diode 300, achieving an adjustable holding voltage, thus reducing the gap between the trigger voltage and the holding voltage. Furthermore, the trigger voltage of the ESD protection circuit 100 may be determined by the layout parameter S, which is the distance between the boundary of the second part 1032 of the second region 103 to the boundary of the first region 107. When S is changed, the ESD protection circuit 100 can have a different trigger voltage, e.g. in the manner described above in relation to FIG. 1(a).

Figure 8:
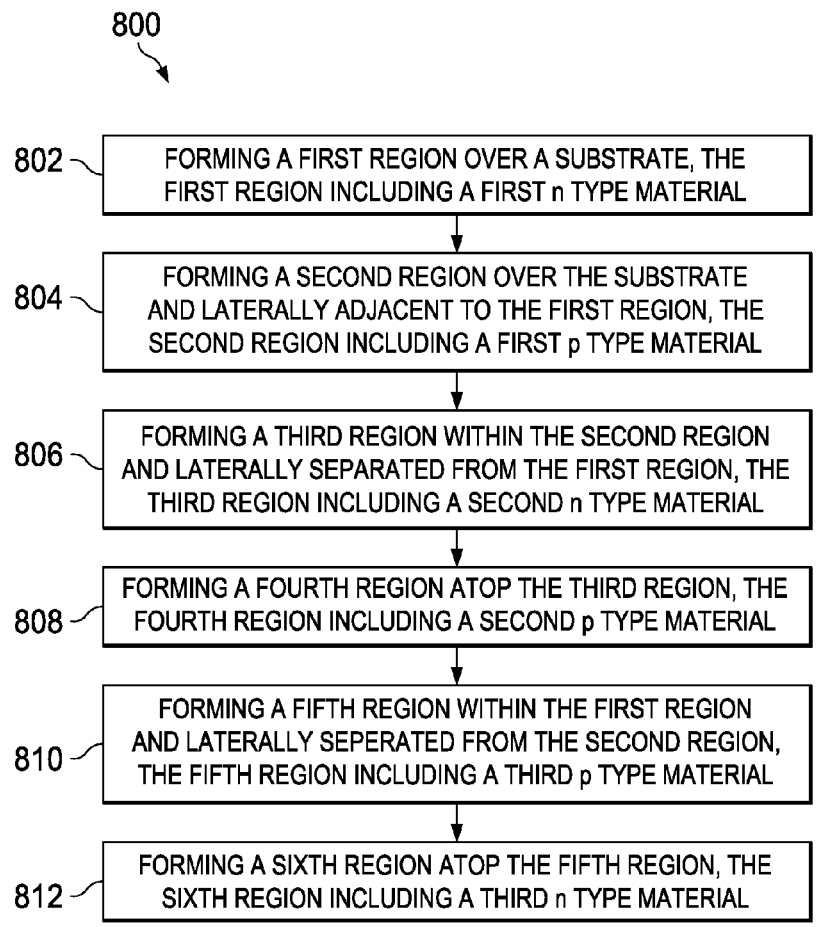
FIG. 8 shows a method of forming a semiconductor device, in accordance with some embodiments.

FIG. 8 shows a method 800 of forming a semiconductor device. The method 800 may, for example, be used to manufacture at least one of the ESD protection circuits 100 shown in FIGS. 1(a)-1(d), 2(a)-2(c), 3(a)-3(b), 4(a)-4(b), 5(a)-5(c), 6(a)-6(b), and 7. The method 800 may include: forming a first region over a substrate, the first region including a first n type material (in 802); forming a second region over the substrate and laterally adjacent to the first region, the second region including a first p type material (in 804); forming a third region within the second region and laterally separated from the first region, the third region including a second n type material (in 806); forming a fourth region atop the third region, the fourth region including a second p type material (in 808); forming a fifth region within the first region and laterally separated from the second region, the fifth region including a third p type material (in 810); and forming a sixth region atop the fifth region, the sixth region including a third n type material (in 812). While the method 800 has been described in the sequence presented in FIG. 8, it should be noted that another sequence of steps may be used to manufacture at least one of the ESD protection circuits 100 shown in FIGS. 1(a)-1(d), 2(a)-2(c), 3(a)-3(b), 4(a)-4(b), 5(a)-5(c), 6(a)-6(b), and 7. Furthermore, some of the steps shown in the method 800 may be performed simultaneously. For example, a region may be formed simultaneously with at least one other region. Accordingly, the method 800 should not be limited to the sequence of steps shown in FIG. 8.

According to various embodiments presented herein, a semiconductor device may be provided. The semiconductor device may include: a substrate; a first region over the substrate, the first region including a first n type material; a second region over the substrate and laterally adjacent to the first region, the second region including a first p type material; a third region disposed within the second region and laterally separated from the first region, the third region including a second n type material; a fourth region disposed atop the third region, the fourth region including a second p type material; a fifth region disposed within the first region and laterally separated from the second region, the fifth region including a third p type material; and a sixth region disposed atop the fifth region, the sixth region including a third n type material.

According to various embodiments presented herein, a semiconductor device may be provided. The semiconductor device may include: a substrate; a first region over the substrate, the first region including a first n type material; a second region over the substrate and laterally adjacent to the first region, wherein the second region includes a first part including a first p type material and a second part including a second p type material; a third region disposed within the second part of the second region and laterally separated from the first part of the second region, the third region including a second n type material; a fourth region disposed atop the third region, the fourth region including a third p type material; a fifth region disposed within the first region and laterally separated from the second region, the fifth region including a fourth p type material; and a sixth region disposed atop the fifth region, the sixth region including a third n type material.

According to various embodiments presented herein, a method of forming a semiconductor device may be provided. The method may include: forming a first region over a substrate, the first region including a first n type material; forming a second region over the substrate and laterally adjacent to the first region, the second region including a first p type material; forming a third region within the second region and laterally separated from the first region, the third region including a second n type material; forming a fourth region atop the third region, the fourth region including a second p type material; forming a fifth region within the first region and laterally separated from the second region, the fifth region including a third p type material; and forming a sixth region atop the fifth region, the sixth region including a third n type material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a first region over the substrate, the first region comprising a first n type material;
   a second region over the substrate and laterally adjacent to the first region, the second region comprising a first p type material;
   a third region disposed within the second region and laterally separated from the first region, the third region comprising a second n type material;
   a fourth region disposed atop the third region, the fourth region comprising a second p type material;
   a fifth region disposed within the first region and laterally separated from the second region, the fifth region comprising a third p type material; and
   a sixth region disposed atop the fifth region, the sixth region comprising a third n type material.

2. The semiconductor device of claim 1, further comprising a first isolation area disposed between the sixth region and the fourth region, the first isolation area further disposed between a portion of the fifth region and a portion of the third region.

3. The semiconductor device of claim 1, further comprising a second isolation area disposed laterally adjacent to the fourth region on a side of the fourth region facing away from the sixth region.

4. The semiconductor device of claim 3, further comprising a diffusion area disposed laterally adjacent to the second isolation area on a side of the second isolation area facing away from the fourth region.

5. The semiconductor device of claim 1, further comprising an n type buried layer disposed over the substrate and beneath the first region and the second region.

6. The semiconductor device of claim 1, further comprising a first contact connected to the sixth region, a second contact connected to the fourth region, and a third contact connected to the second region.

7. The semiconductor device of claim 1, wherein the second region comprises a first part laterally adjacent to the first region and over the substrate and a second part laterally adjacent to a first portion of the first part of the second region, wherein the third region is disposed within the second part of the second region.

8. The semiconductor device of claim 7, wherein the second part is further disposed over a second portion of the first part of the second region.

9. The semiconductor device of claim 1, wherein the second p type material is a p+ type material, and the third p type material is a p− type material.

10. A method of forming a semiconductor device, the method comprising:
- forming a first region over a substrate, the first region comprising a first n type material;
- forming a second region over the substrate and laterally adjacent to the first region, the second region comprising a first p type material;
- forming a third region within the second region and laterally separated from the first region, the third region comprising a second n type material;
- forming a fourth region atop the third region, the fourth region comprising a second p type material;
- forming a fifth region within the first region and laterally separated from the second region, the fifth region comprising a third p type material; and
- forming a sixth region atop the fifth region, the sixth region comprising a third n type material.

11. The method of claim 10, further comprising forming a first isolation area between the sixth region and the fourth region.

12. The method of claim 10, further comprising forming a first contact connected to the sixth region, a second contact connected to the fourth region, and a third contact connected to the second region.

13. The method of claim 10, wherein the forming the second region comprises forming a first part comprising the first p type material and forming a second part comprising a fourth p type material contained within the first part of the second region, wherein the third region is contained within or adjacent to the second part of the second region.

14. The method of claim 13, wherein the first p type material is a p− type material, and the fourth p type material is a p− type material.

15. A semiconductor device comprising:
- a substrate;
- a first region over the substrate, the first region comprising a first n type material;
- a second region over the substrate and laterally adjacent to the first region, wherein the second region comprises a first part comprising a first p type material and a second part comprising a second p type material;
- a third region disposed within the second part of the second region and laterally separated from the first part of the second region, the third region comprising a second n type material;
- a fourth region disposed atop the third region, the fourth region comprising a third p type material;
- a fifth region disposed within the first region and laterally separated from the second region, the fifth region comprising a fourth p type material; and
- a sixth region disposed atop the fifth region, the sixth region comprising a third n type material.

16. The semiconductor device of claim 15, further comprising a first isolation area disposed between the sixth region and the fourth region.

17. The semiconductor device of claim 15, further comprising a first contact connected to the sixth region, a second contact connected to the fourth region, and a third contact connected to the second part of the second region.

* * * * *